(12) United States Patent
Xu et al.

(10) Patent No.: US 11,366,351 B2
(45) Date of Patent: Jun. 21, 2022

(54) DISPLAY PANEL AND DISPLAY DEVICE (71) Applicants: BOE Technology Group Co., Ltd., Beijing (CN); Hefei BOE Optoelectronics Technology Co., Ltd., Anhui (CN)

(72) Inventors: Jun Xu, Beijing (CN); Qing Zhang, Beijing (CN); Fusheng Huang, Beijing (CN); Shouzheng Wu, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 709 days.

(21) Appl. No.: 16/302,991

(22) PCT Filed: Feb. 8, 2018

(86) PCT No.: PCT/CN2018/075855
§ 371 (c)(1),
(2) Date: Nov. 19, 2018

(87) PCT Pub. No.: WO2018/223726
PCT Pub. Date: Dec. 13, 2018

(65) Prior Publication Data
US 2021/0223606 A1 Jul. 22, 2021

(30) Foreign Application Priority Data
Jun. 8, 2017 (CN) .......................... 201710428613.9

(51) Int. Cl.
*G02F 1/1335* (2006.01)
*H01L 27/32* (2006.01)
*H01L 51/52* (2006.01)

(52) U.S. Cl.
CPC .. *G02F 1/133502* (2013.01); *G02F 1/133514* (2013.01); *G02F 1/133526* (2013.01);
(Continued)

(58) Field of Classification Search
CPC ......... G02F 1/133502; G02F 1/133514; G02F 1/133526; G02F 1/133553;
(Continued)

(56) References Cited

U.S. PATENT DOCUMENTS

2007/0242334 A1* 10/2007 Selbrede .............. G02B 6/2852
359/222.1
2010/0027124 A1* 2/2010 Nagahama ........... G02B 5/0226
359/599

(Continued)

FOREIGN PATENT DOCUMENTS

| CN | 103413495 | * 11/2013 | ............... G09F 9/30 |
| CN | 103413495 A | 11/2013 | |

(Continued)

OTHER PUBLICATIONS

May 7, 2018—(WO) International Search Report and Written Opinion Appn PCT/CN2018/075855 with English Translation.

*Primary Examiner* — Charles S Chang
(74) *Attorney, Agent, or Firm* — Banner & Witcoff, Ltd.

(57) ABSTRACT

Embodiments of the present disclosure provide a display panel and a display device. The display panel includes a retroreflective layer disposed on a light-emitting side, wherein the retroreflective layer includes a retroreflective region and a transmissive region, the retroreflective region is configured to reflect light irradiated on the retroreflective region along an opposite direction of an incident direction or close to the opposite direction of the incident direction; the display panel comprises a pixel region and a pixel define region for defining the pixel region, and the pixel region is
(Continued)

at least partially overlapped with the transmissive region along a thickness direction of the display panel.

20 Claims, 5 Drawing Sheets

(52) U.S. Cl.
CPC ...... G02F 1/133553 (2013.01); H01L 27/322 (2013.01); H01L 51/5275 (2013.01); H01L 51/5281 (2013.01); *G02F 1/133519* (2021.01)

(58) Field of Classification Search
CPC ............. G02F 1/133519; H01L 27/322; H01L 51/5275; H01L 51/5281
USPC ........................................................ 349/137
See application file for complete search history.

(56) References Cited

U.S. PATENT DOCUMENTS

| | | | | |
|---|---|---|---|---|
| 2015/0103392 A1* | 4/2015 | Rieger | ................... | G02B 5/122 |
| | | | | 359/296 |
| 2018/0113356 A1* | 4/2018 | Lee | ................... | G02F 1/134309 |
| 2019/0293846 A1* | 9/2019 | Wang | ..................... | G02B 5/136 |

FOREIGN PATENT DOCUMENTS

| | | | |
|---|---|---|---|
| CN | 103913886 | A | 7/2014 |
| CN | 104678641 | A | 6/2015 |
| CN | 105866999 | A | 8/2016 |
| CN | 206020874 | U | 3/2017 |
| CN | 206147215 | U | 5/2017 |
| CN | 106990602 | A | 7/2017 |

* cited by examiner

DISPLAY PANEL AND DISPLAY DEVICE

The application is a U.S. National Phase Entry of International Application No. PCT/CN2018/075855 filed on Feb. 8, 2018, designating the United States of America and claiming priority to Chinese Patent Application No. 201710428613.9, filed Jun. 8, 2017. The present application claims priority to and the benefit of the above-identified applications and the above-identified applications are incorporated by reference herein in their entirety.

TECHNICAL FIELD

Embodiments of the present disclosure relate to a display panel and a display device.

BACKGROUND

With the rapid development of display technology, various display devices have emerged. However, the design of display devices is currently generally affected by ambient light. The ambient light is incident into a surface of the display device and reflected on the surface of the display device. The light will enter the human eyes, along with information light emitted by the display device, by specular reflection, diffuse reflection, Fresnel reflection or other means, which affects the viewer's viewing effect. For example, for a large-size display device, Fresnel reflection occurs on a surface of the display device, and the reflection index of the ambient light is different at different incident angles, thereby causing the edge of the display device to be white. Thus, after the Fresnel reflection light enters the human eyes, what the human eyes sees is a display image with white edge. Specular reflection will cause the glare problem, so the specular reflection light will affect the viewing of the image after entering the human eyes. The diffuse reflection light will reduce the ambient contrast of the display device after entering the human eyes.

SUMMARY

Embodiments of the present disclosure provide a display panel and a display device, which can reduce ambient light entering the human eyes after reflected on a surface of the display panel.

At one aspect, a display panel is provided, the display panel comprises a retroreflective layer disposed on a light-emitting side, wherein the retroreflective layer includes a retroreflective region and a transmissive region, the retroreflective region is configured to reflect light irradiated on the retroreflective region along an opposite direction of an incident direction or close to the opposite direction of the incident direction; the display panel comprises a pixel region and a pixel define region for defining the pixel region, and the pixel region is at least partially overlapped with the transmissive region along a thickness direction of the display panel.

For example, the retroreflective region is at least partially overlapped with the pixel define region of the display panel along the thickness direction of the display panel.

For example, the retroreflective region is overlapped with the pixel define region and a portion of the pixel region of the display panel along the thickness direction of the display panel.

For example, the pixel region is completely overlapped with the transmissive region along the thickness direction of the display panel.

For example, the transmissive region of the retroreflective layer is a hollowed-out structure.

For example, the retroreflective region of the retroreflective layer includes an organic material layer and a plurality of transparent spherical particles; each of the plurality of transparent spherical particles is partially embedded into the organic material layer; a portion of the spherical particle not embedded into the organic material layer is close to outside of the display panel; and the refractive index of the spherical particle is different from the refractive index of the organic material layer.

For example, a diameter of the spherical particle is 1 µm-10 µm.

For example, a material of the organic material layer is niobium pentaoxide; and a material of the spherical particle is polymethyl methacrylate or polycarbonate.

For example, a height of the spherical particle embedded into the organic material layer is equal to one-half of a diameter of the spherical particle.

For example, the display panel comprises a base substrate; the retroreflective layer is disposed on the base substrate; the display panel further comprises convergent lenses being disposed on a side of the base substrate opposite to the retroreflective layer and being in one-to-one correspondence with the pixel regions; and a primary optical axis of the convergent lens is parallel to the thickness direction of the display panel and runs through a center of the transmissive region of the retroreflective layer.

For example, the transmissive region covers a light spot formed at the retroreflective layer by light converged by the convergent lens.

For example, a focal length of the convergent lens is equal to a distance from a center of the convergent lens to a surface of the light-emitting side of the display panel.

For example, the display panel comprises a color filter patterns; and a surface of an incident side of the CF pattern is protruded towards a direction away from the retroreflective layer, so as to form the convergent lens.

For example, the display panel further comprises an overcoat; the overcoat covers a convex surface of the convergent lens; and a refractive index of the OC is less than a refractive index of the convergent lens.

For example, the display panel is an organic light-emitting diode display panel; and the convergent lens is disposed between a light emitting layer of the display panel and a side of the base substrate opposite to the retroreflective layer.

For example, the display panel is a liquid crystal display panel; a backlight unit provides backlight for the display panel; and the convergent lens is disposed between the backlight unit and a side of the base substrate opposite to the retroreflective layer.

At another aspect, a display device is provided, the display device comprises the display panel as mentioned above.

For example, the display device further comprises a backlight unit which is configured to emit collimated light or approximately collimated light.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Glare can be prevented by adopting the design of curved surface screen or by bonding an anti-glare (AG) film. The curved surface screen may only solve the glare problem caused by the specular reflection at the center position of the curved surface screen, and there will still be specular reflection at other positions, so the specular reflection light will also enter the human eyes. In addition, the bonding of the AG film cannot solve the degradation problem of the image displaying effect caused by the diffuse reflection and the Fresnel reflection. Although the bonding of the AG film can solve the glare problem caused by the specular reflection, ambient light cannot be prevented from entering the human eyes (by diffuse reflection or other means), and the diffuse reflection light will reduce the ambient contrast of the display device after entering the human eyes.

Figure 1A:
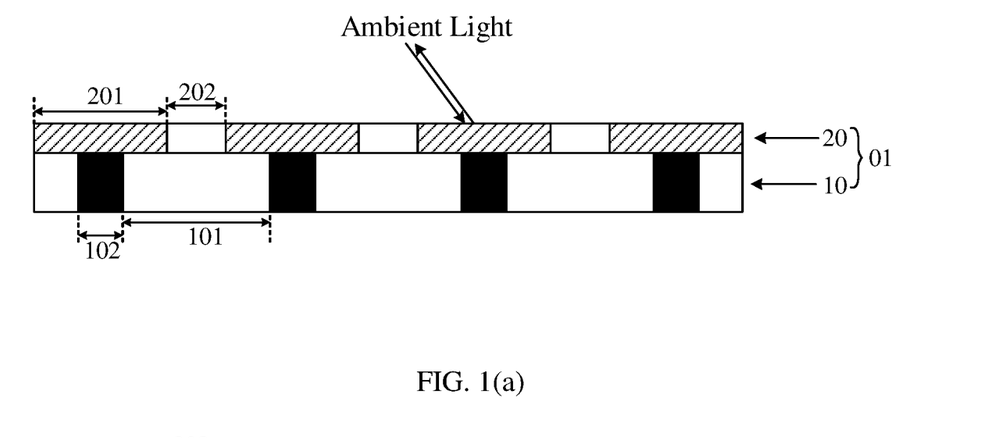
FIG. 1(a) is a schematic structural view 1 of a display panel provided by an embodiment of the present disclosure.
Figure 1B:
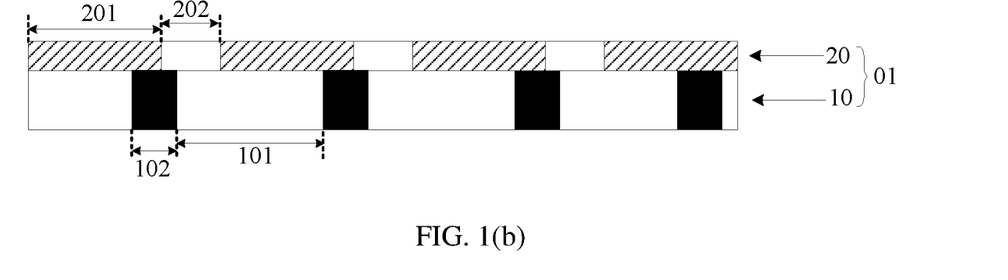
FIG. 1(b) is a schematic structural view 2 of a display panel provided by an embodiment of the present disclosure.

An embodiment of the present disclosure provides a display panel 01, which, as shown in FIGS. 1(a) and 1(b), comprises a retroreflective layer 20 disposed on a light-emitting side. The retroreflective layer 20 includes a retroreflective region 201 and a transmissive region 202. The retroreflective region 201 is configured to reflect light irradiated thereon along an opposite direction of the incident direction or close to the opposite direction of the incident direction (as shown by a one-way arrow in FIG. 1(a)). The display panel 01 comprises a pixel region 101 and a pixel define region 102 for defining the pixel region 101. There is an overlapped region between the pixel region 101 and the transmissive region 202 along a thickness direction of the display panel 01.

Wherein, the structure of the retroreflective region 201 in the retroreflective layer 20 is not limited, as long as the retroreflective region 201 can allow light irradiated thereon to be subjected to retroreflection, namely allowing the light irradiated thereon to be reflected along the opposite direction of the incident direction or close to the opposite direction of the incident direction. In addition, as for the structure of the transmissive region 202, as long as light can run therethrough, layers that enable light to run through may be arranged, or any layer may also be not arranged. When the transmissive region 202 is provided with a layer that enable light to run through, the material of the transmissive region 202 shall be high-transmittance material, for instance, may be $SiO_2$, etc. On this basis, the retroreflective layer 20 may be formed on the light-emitting side by coating.

In addition, the type of the display panel is not limited. The display panel may be an LCD panel and may also be an OLED display panel. When the display panel is an LCD panel, a backlight unit is required to provide a light source for the display panel 01. At this point, the display panel 01 comprises an array substrate, an opposed substrate, and a liquid crystal layer disposed between the array substrate and the opposed substrate. On this basis, when the display panel is an LCD panel, the pixel region 101 refers to a light-transmitting region, and the pixel define region 102 refers to a non-transmissive region, namely a BM region. When the display panel is an OLED display panel, the OLED display panel comprises an anode, a cathode and an organic layer. At this point, the pixel region 101 of the display panel 01 refers to a luminous region, and the pixel define region 102 refers to a non-luminous region.

It should be noted that the retroreflective layer 20 is disposed on the light-emitting side. As shown by the drawings of the present disclosure, the retroreflective layer 20 may be disposed on a surface of a light-emitting side of a base substrate 10. When the display panel 01 further comprises a polarizer, the retroreflective layer 20 may also be disposed on a surface of a light-emitting side of the polarizer.

The display panel 01 in the accompanying drawings of the present disclosure only illustrates the retroreflective layer 20, the base substrate 10 and other parts relevant to the present disclosure, and does not show other parts irrelevant to the present invention.

Illustratively, as for an LCD panel, the base substrate 10 may be a base substrate of a CF (Color Filter) substrate. The CF substrate is arranged opposite to the array substrate, and a liquid crystal layer is disposed between the two substrates.

For instance, as for an OLED display panel, the base substrate 10 may be a cover plate on a light-emitting side of the display panel. Or if the display panel comprises a color filter, the base substrate 10 may be a base substrate of a substrate provided with the color filter on the light-emitting side. No limitation will be given here in the embodiment of the present disclosure.

On this basis, along a thickness direction of the display panel 01, the retroreflective region 201 may cover the pixel define region 102 of the display panel 01 as shown in FIG. 1(a); or there may be an overlapped region between the retroreflective region 201 and a portion of the pixel define region 102 of the display panel 01 as shown in FIG. 1(b).

Figure 2:
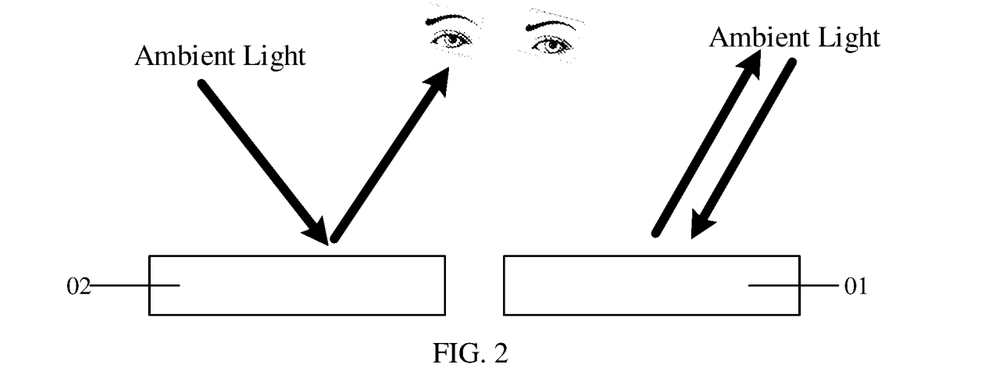
FIG. 2 is an effect comparison chart of a display panel provided by an embodiment of the present disclosure and a display panel known by an inventor.

Herein, as shown in FIG. 2, 01 refers to the display panel provided by the embodiment of the present disclosure, and 02 refers to the display panel known by an inventor. After incident into a surface of the display panel known by an inventor, ambient light will be reflected and enter the human eyes. And the ambient light will be reflected along the opposite direction of the incident direction or close to the opposite direction of the incident direction after incident into a surface of the display panel 01 provided by the embodiment of the present disclosure, so the ambient light incident into the surface of the display panel will not enter the human eyes and then will not affect the display effect of the display panel. It is generally believed that the human eye is not a light source. Even considering the human eye as a secondary light source, as light incident into the surface of the display panel 01 from the human eye is very little, and the impact of this part of reflected light on display is also very low, it is not considered.

An embodiment of the present disclosure provides a display panel 01. The display panel 01 comprises a retroreflective layer 20 on a light-emitting side; the retroreflective layer 20 includes a retroreflective region 201; and the retroreflective region 201 can reflect light irradiated thereon along an opposite direction of the incident direction or close to the opposite direction of the incident direction. Thus, ambient light will be reflected along the opposite direction of the incident direction of the ambient light or close to the opposite direction of the incident direction after incident into the retroreflective region 201. In this case, the ambient light incident into the retroreflective region 201 of the display panel 01 will not be reflected to enter the human eyes. Therefore, no matter the ambient light is subjected to which kind of reflection (specular reflection, diffuse reflection, Fresnal reflection, etc.) on the surface of the display panel 01, the ambient light will be subjected to retroreflection as long as the ambient light is incident into the retroreflective region 201 of the display panel 01, so the ambient light entering the human eyes after reflected on the surface of the display panel 01 can be reduced, and hence the visual effect of the display panel 01 in the viewing process can be improved.

Figure 3:
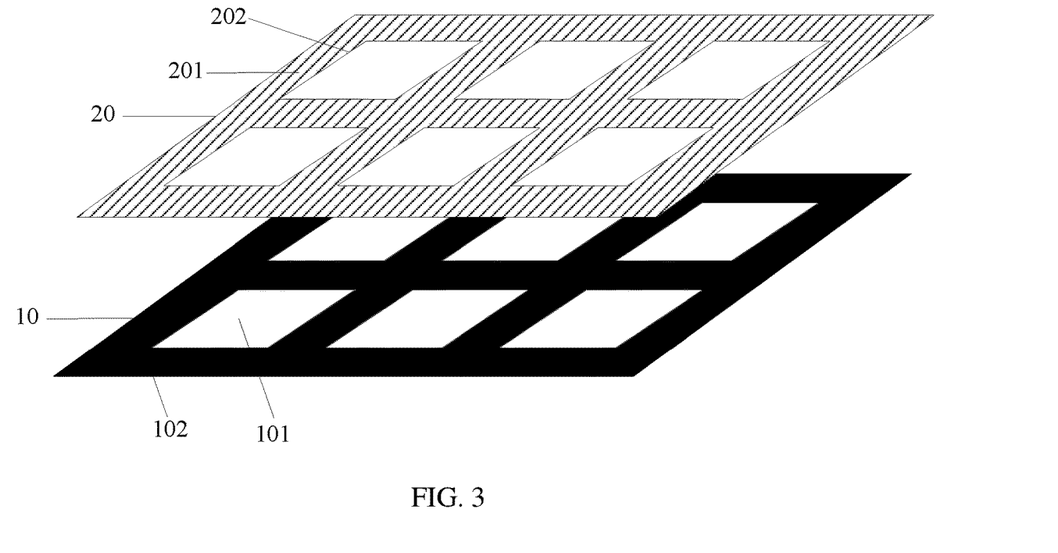
FIG. 3 is a schematic structural view 3 of a display panel provided by an embodiment of the present disclosure.

Illustratively, as shown in FIG. 3, the retroreflective region 201 is overlapped with the pixel define region 102 of the display panel 01 along the thickness direction of the display panel 01.

Wherein, the retroreflective region 201 is overlapped with the pixel define region 102 of the display panel 01. At this point, both a shape and a size of the retroreflective region 201 and the pixel define region 102 are the same.

In the embodiment of the present disclosure, as no light is emitted from the pixel define region 102, when the retroreflective region 201 is overlapped with the pixel define region 102 of the display panel 01, the normal emission of light of the display panel 01 will not be affected, so the display effect of the display panel 01 will not be affected. In addition, in the case of certain size of the display panel 01, when the area of the retroreflective region 201 is larger, the ambient light entering the human eyes, after incident into the surface of the display panel 01 and reflected on the surface of the display panel 01, is less, and the display effect of the display panel 01 can be more favorably improved. Therefore, compare with the case that there is an overlapped region between the retroreflective region 201 and a portion of the pixel define region 102, the case in the embodiment of the present disclosure that the retroreflective region 201 is overlapped with the pixel define region 102 of the display panel 01 can increase an area of the retroreflective region 201 and then reduce the ambient light entering the human eyes after reflected on the surface of the display panel 01.

Figure 4:
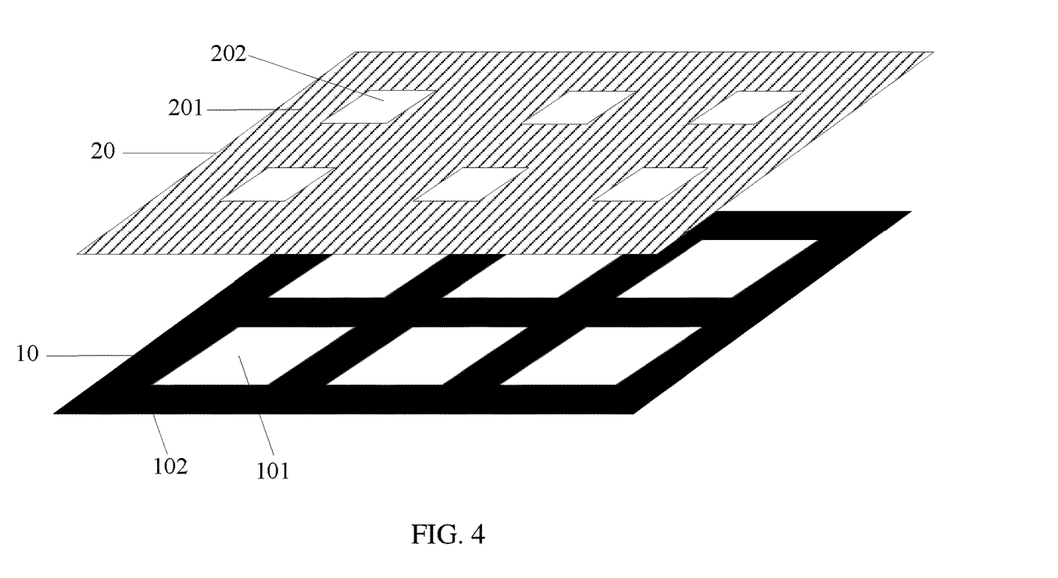
FIG. 4 is a schematic structural view 4 of a display panel provided by an embodiment of the present disclosure.

When a ratio of the area of the retroreflective region 201 to the area of the retroreflective layer 20 is larger, the ambient light entering the human eyes after reflected on the surface of the display panel 01 is less, and the display effect of the display panel 01 can be more favorably improved. Therefore, illustratively, as shown in FIGS. 1(*a*) and 4, the retroreflective region 201 is overlapped with the pixel define region 102 and a portion of the pixel region 102 of the display panel 01 along the thickness direction of the display panel 01. Thus, when the ambient light is incident to the pixel define region 102 of the display panel 01 and the pixel region 101 covered by the retroreflective region 201, the ambient light will be reflected along the opposite direction of the incident direction or close to the opposite direction of the incident direction, so the ambient light entering the human eyes will be reduced, and then the display effect of the display panel 01 can be further improved.

Based on the above description, it should be noted that light emitted from the pixel region 101 of the display panel 01 may be emitted from the transmissive region 202 of the retroreflective layer 20.

Figure 5:
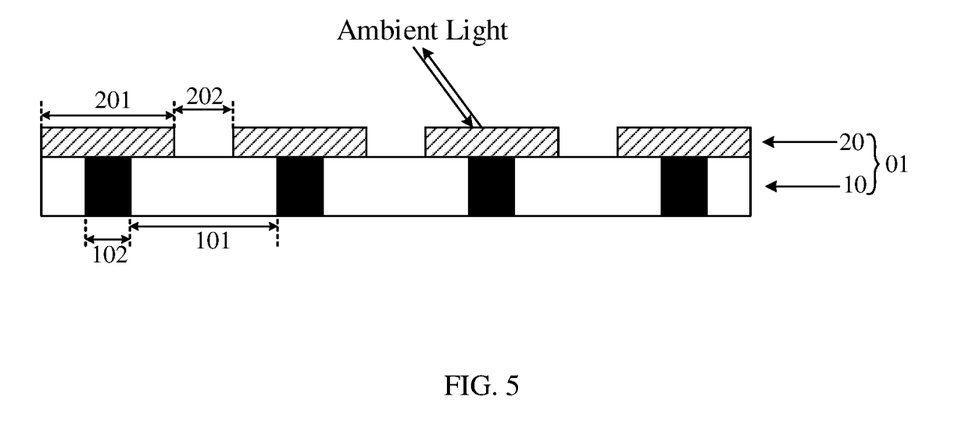
FIG. 5 is a schematic structural view 5 of a display panel provided by an embodiment of the present disclosure.

Illustratively, as shown in FIG. 5, the transmissive region 202 of the retroreflective layer 20 is a hollowed-out structure.

Wherein, that the transmissive region 202 of the retroreflective layer 20 is a hollowed-out structure indicates that the transmissive region 202 of the retroreflective layer 20 is not provided with any structure.

In the embodiment of the present disclosure, as the transmissive region 202 of the retroreflective layer 20 is a hollowed-out structure, on one hand, the transmissive region 202 will not affect the light transmittance of the display panel 01 when the light emitted from the pixel region 101 of the display panel 01 is emitted from the transmissive region 202; and on the other hand, the production cost can be reduced.

Figure 6:
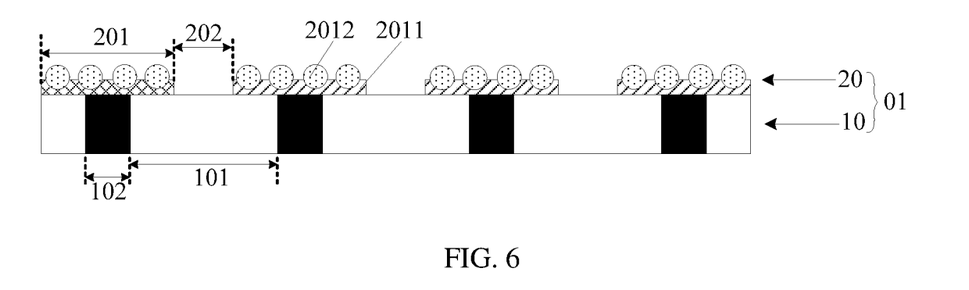
FIG. 6 is a schematic structural view 6 of a display panel provided by an embodiment of the present disclosure.

Illustratively, as shown in FIG. 6, the retroreflective region 201 of the retroreflective layer 20 includes an organic material layer 2011 and a plurality of transparent spherical particles 2012. The spherical particle 2012 is partially embedded into the organic material layer 2011, and a portion of the spherical particle 2012 not embedded into the organic material layer 2011 is close to outside of the display panel 01. Wherein, the refractive index of the spherical particle 2012 is different from the refractive index of the organic material layer 2011.

Wherein, the specific material of the organic material layer 2011 is not limited, for instance, may be resin. The material of the spherical particle 2012 is not limited, for instance, may be glass.

Figure 7:
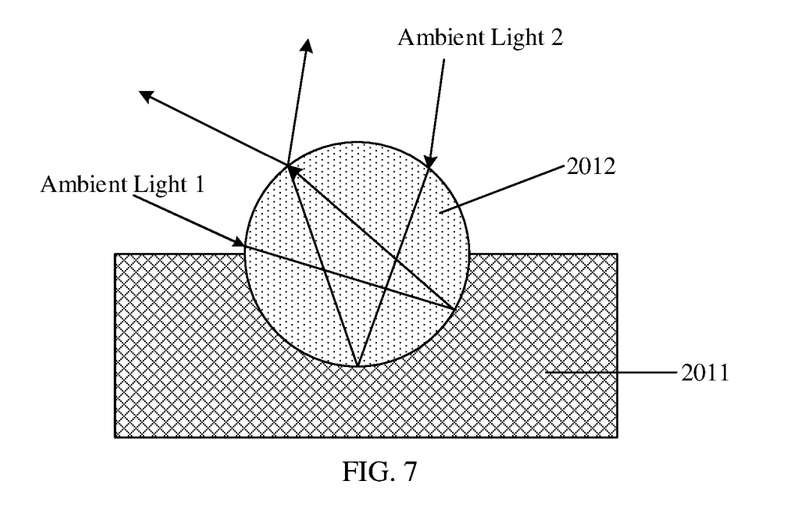
FIG. 7 is a schematic diagram illustrating a retroreflective principle of a retroreflective region in an embodiment of the present disclosure.

Herein, when the retroreflective region 201 includes the organic material layer 2011 and the plurality of transparent spherical particles 2012, the retroreflection principle of the retroreflective region 201 is specifically as shown in FIG. 7. Taking ambient light 1 as an example, the ambient light 1 is incident to a surface of the spherical particle 2012 from the air, refracted on the surface of the spherical particle 2012, and incident into the spherical particle 2012; and as the refractive index of the spherical particle 2012 is different from the refractive index of the organic material layer 2011, the ambient light 1 is reflected on an interface of the spherical particle 2012 and the organic material layer 2011 and subsequently incident into the air from the spherical particle 2012. As the spherical particle 2012 is spherical, according to the geometric relationship, it can be concluded that incident light entering the spherical particle 2012 and emergent light emitted from the spherical particle 2012 are parallel to each other, namely the ambient light 1 is subjected to retroreflection in the retroreflective region 201. As can be seen from FIG. 7, no matter the ambient light is incident into the retroreflective region 201 from any angle (for instance, the ambient light 1 and ambient light 2), the light will be reflected back along the original path or reflected back along a path close to the original path. It should be noted that the ambient light 1 is incident to the surface of the spherical particle 2012 from the air; most of the light enters inside of the spherical particle 2012 after refracted on the surface of the spherical particle 2012; and a portion of the light may be directly reflected on the surface of the spherical particle 2012 and does not enter inside of the spherical particle 2012. As the light directly reflected on the surface of the spherical particle 2012 is very little, only a small amount of light directly reflected on the surface of the spherical particle 2012 enters the human eyes, so the impact of the portion of light on the display image viewed by the viewer may be omitted.

Based on the above description, in order to ensure that the retroreflective region 201 has good retroreflective effect, illustratively, a diameter of the spherical particle 2012 is 1 μm-10 μm.

It should be noted that the description that the refractive index of the spherical particle 2012 is different from the refractive index of the organic material layer 2011 may be that the refractive index of the spherical particle 2012 is greater than the refractive index of the organic material layer 2011, or may also be that the refractive index of the organic material layer 2011 is greater than the refractive index of the spherical particle 2012. When the difference between the refractive index of the organic material layer 2011 and the refractive index of the spherical particle 2012 is larger, the reflectivity of the ambient light at the interface of the spherical particle 2012 and the organic material layer 2011 is higher. Therefore, for instance, the difference between a refractive index of a forming material of the spherical particle 2012 and the refractive index of a forming material of the organic material layer 2011 shall be as large as possible. When the difference between the refractive index of the organic material layer 2011 and the refractive index of the spherical particle 2012 is larger, the reflectivity is higher, and the retroreflective effect is better. Illustratively, the material of the organic material layer 2011 is niobium pentaoxide ($Nb_2O_5$), and the material of the spherical particle 2012 is polymethyl methacrylate (PMMA) or polycarbonate (PC).

In the embodiment of the present disclosure, as the retroreflective region 201 includes the organic material layer 2011 and the plurality of transparent spherical particles 2012, and the refractive index of the spherical particle 2012 is different from the refractive index of the organic material layer 2011, when the ambient light is incident to the retroreflective region 201 of the retroreflective layer 20, retroreflection will occur, so the ambient light can be prevented from entering the human eyes after reflection and affecting the viewing of the display image by the viewer.

A retroreflective efficiency includes two aspects: one is the coupling-in ratio of incident light, and the other is the coupling-out ratio of reflected light. If the spherical particle 2012 is completely embedded into the organic material layer 2011, no light is coupled in; and vice versa, if the spherical particle 2012 is disposed on the organic material layer 2011 and not embedded into the organic material layer 2011, no reflected light is coupled out. Based on this, in the embodiment of the present disclosure, moreover, a height of the spherical particle 2012 embedded into the organic material layer 2011 is equal to one-half of a diameter of the spherical particle 2012.

In the embodiment of the present disclosure, when the height of the spherical particle 2012 embedded into the organic material layer 2011 is equal to one-half of the diameter of the spherical particle 2012, the retroreflective efficiency of the retroreflective region 201 is the highest.

Figure 8A:
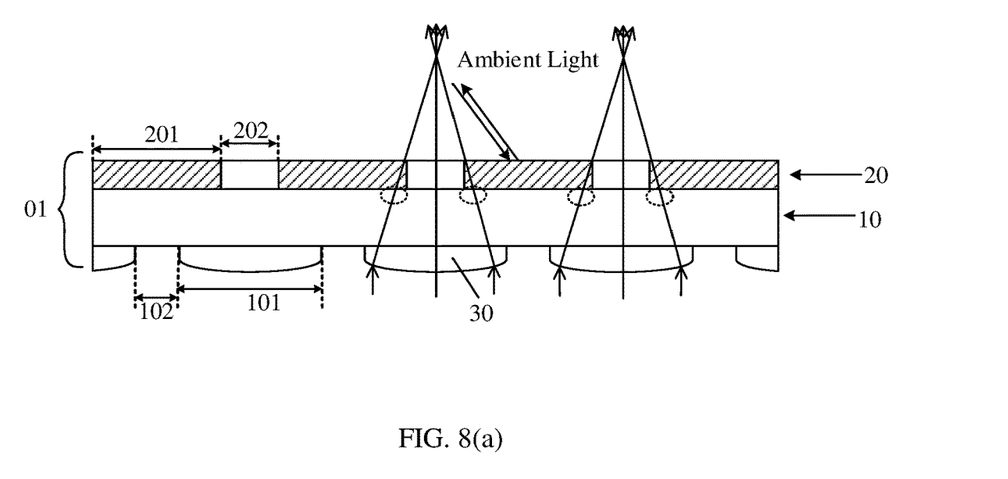
FIG. 8(a) is a schematic structural view 7 of a display panel provided by an embodiment of the present disclosure.
Figure 8B:
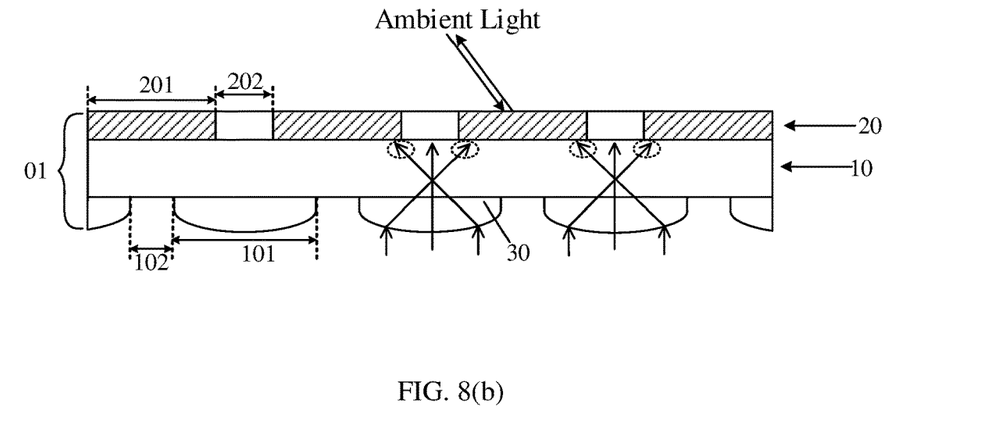
FIG. 8(b) is a schematic structural view 8 of a display panel provided by an embodiment of the present disclosure.

The retroreflective region 201 of the retroreflective layer 20 not only has retroreflective function on the ambient light but also may perform retroreflection on light emitted from the display panel 01 when incident to the retroreflective region 201, so the light exitance of the display panel 01 will be affected. Therefore, in the embodiment of the present disclosure, illustratively, as shown in FIGS. 8(a) and 8(b), the display panel 01 comprises convergent lenses 30 being disposed on a side of the retroreflective layer 20 away from a surface of the display panel 01 and being in one-to-one correspondence with the pixel regions 101, wherein a primary optical axis of the convergent lens 30 is parallel to the thickness direction of the display panel 01 and runs through the center of the transmissive region 202 of the retroreflective layer 20.

Wherein, the convergent lens 30 is also referred to as convex lens and may have the function of converging light beams. In addition, the type of the convergent lens 30 is not limited, and the convergent lens may be a biconvex lens, a plane convex lens or a convex lens. As each layer of the display panel 01 is basically flat, in order to facilitate to arrange the convergent lens 30, illustratively, the convergent lens 30 is a plane convex lens.

In addition, it should be understood by those skilled in the art that the convergent lens 30 converges the light emitted from the pixel region 101 of the display panel 01. When the display panel 01 is an LCD panel, the LCD panel adopts a backlight unit to provide a light source for the LCD panel, so the convergent lens 30 may be disposed at any position between a side of the retroreflective layer 20 away from the surface of the display panel 01 and the backlight unit. When the display panel 01 is an OLED display panel, the OLED display panel emits light through a light emitting layer, so the convergent lens 30 may be disposed at any position between a side of the retroreflective layer 20 away from the surface of the display panel 01 and the light emitting layer.

It should be noted that as the display panel 01 comprises the convergent lenses 30 in one-to-one correspondence with the pixel regions 101 and the primary optical axis of the convergent lens 30 runs through the center of the transmissive region 202 of the retroreflective layer 20, the light emitted by the pixel region 101 may be emitted from the transmissive region 202 after converged by the convergent lens 30. In addition, a focus of the convergent lens 30 may be located outside the display panel 01 as shown in FIG. 8(a), and may also be disposed in the display panel 01 as shown in FIG. 8(b), and of course, may also be disposed on a surface of the light-emitting side of the display panel 01. When the focus of the convergent lens 30 is disposed on the surface of the light-emitting side of the display panel 01, the focal length of the convergent lens 30 is equal to a distance from the convergent lens 30 to the surface of the light-emitting side of the display panel 01 (at this point, the thickness of the convergent lens 30 may be omitted).

On this basis, the pixel regions 101 are in one-to-one correspondence with the convergent lenses 30; and along the thickness direction of the display panel 01, the convergent lens 30 may cover the pixel region 101, or there is an overlapped region between the convergent lens 30 and the pixel region 101, but the convergent lens 30 does not cover the pixel region 101. In order to allow the light emitted from the pixel region 101 to be emitted from the transmissive region 202 as much as possible, in the embodiment of the present disclosure, illustratively, the convergent lens 30 covers the pixel region 101 along the thickness direction of the display panel 01.

In the embodiment of the present disclosure, the display panel 01 comprises the convergent lenses 30 in one-to-one correspondence with the pixel regions 101; the convergent lens 30 may converge the light emitted from the pixel region 101 of the display panel 01; and the primary optical axis of the convergent lens 30 runs through the center of the transmissive region 202 of the retroreflective layer 20. In this case, more light can be emitted from the transmissive region 202 of the retroreflective layer 20.

On this basis, in the case of certain area of the retroreflective layer 20, when the area of the transmissive region 202 is reduced, the area of the retroreflective region 201 is increased, and the increased area of the retroreflective region 201 can further reduce the ambient light entering the human eyes after reflected on the surface of the display panel 01, so the display effect of the display panel 01 can be further improved. On this basis, as the convergent lens 30 can converge light, even the area of the transmissive region 202 is set to be very small, the light can also be emitted from the transmissive region 202. Thus, the area of the transmissive region 202 may be set to be small, and the area of the retroreflective region 201 is increased.

Figure 8C:
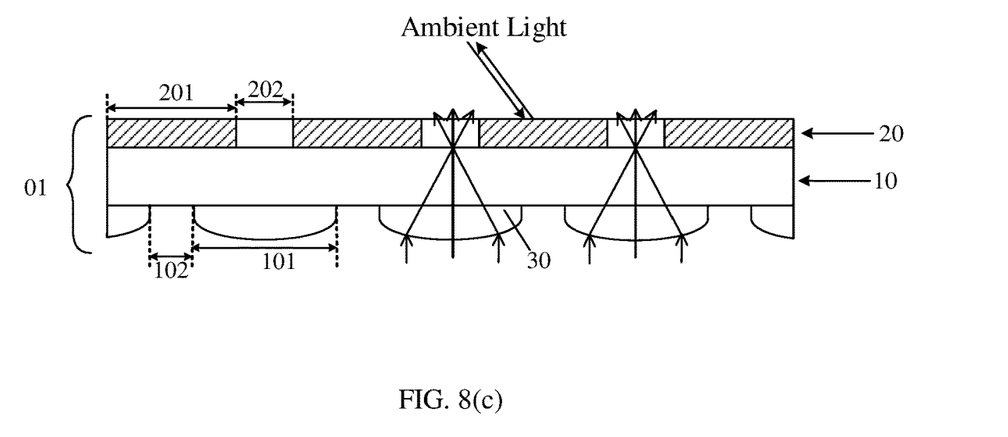
FIG. 8(c) is a schematic structural view 9 of a display panel provided by an embodiment of the present disclosure.

As light will diverge after converged by the convergent lens 30, if the focus of the convergent lens 30 is disposed in the display panel 01, when the light diverges after converged by the convergent lens 30, a portion of the light may be blocked by the retroreflective region 201 (as shown by dotted circles in FIG. 8(b)), so partial light may be unable to be emitted; and if the focus of the convergent lens 30 is disposed outside the display panel 01 and is far away from the surface of the light-emitting side of the display panel 01, a portion of the light may be blocked by the retroreflective regions 201 (as shown by dotted circles in FIG. 8(a)), so partial light may be unable to be emitted. On this basis, as shown in FIG. 8(c), in the embodiment of the present disclosure, illustratively, the transmissive region 202 covers a light spot formed in the retroreflective layer 20 by the light converged by the convergent lens 30.

It should be noted that the description that the transmissive region 202 covers the light spot formed in the retroreflective layer 20 by the light converged by the convergent lens 30 may be that a border of the transmissive region 202 is overlapped with a border of the light spot formed in the retroreflective layer 20 by the light converged by the convergent lens 30, or may also be that the border of the transmissive region 202 surrounds the border of the light spot formed in the retroreflective layer 20 by the light converged by the convergent lens 30.

Herein, a size of the light spot formed in the retroreflective layer 20 by the light converged by the convergent lens 30 may be obtained according to a curvature of the convergent lens 30 and a distance from the convergent lens 30 to the retroreflective layer 20, and subsequently, a size of the transmissive region 202 is designed according to the size of the light spot, so that the light emitted from the pixel region 101 can be emitted from the transmissive region 202.

In the embodiment of the present disclosure, as the transmissive region 202 is greater than the light spot formed in the retroreflective layer 20 by the light converged by the convergent lens 30, most of the light converged by the convergent lens 30 can be emitted from the transmissive region 202, so the light exitance of the display panel 01 can be improved.

In the embodiment of the present disclosure, when the focal length of the convergent lens 30 is equal to the distance from the center of the convergent lens 30 to the surface of the light-emitting side of the display panel, it can be ensured that the light is emitted from the pixel region as much as possible. Moreover, in the process of manufacturing the display panel 01, the curvature of the convergent lens 30 may be deduced according to the distance from the center of the convergent lens 30 to the surface of the light-emitting side of the display panel 01, so as to manufacture the convergent lens 30 with corresponding curvature. Therefore, in the embodiment of the present disclosure, illustratively, the focal length of the convergent lens 30 is equal to the distance from the center of the convergent lens 30 to the surface of the light-emitting side of the display panel 01.

Figure 9:
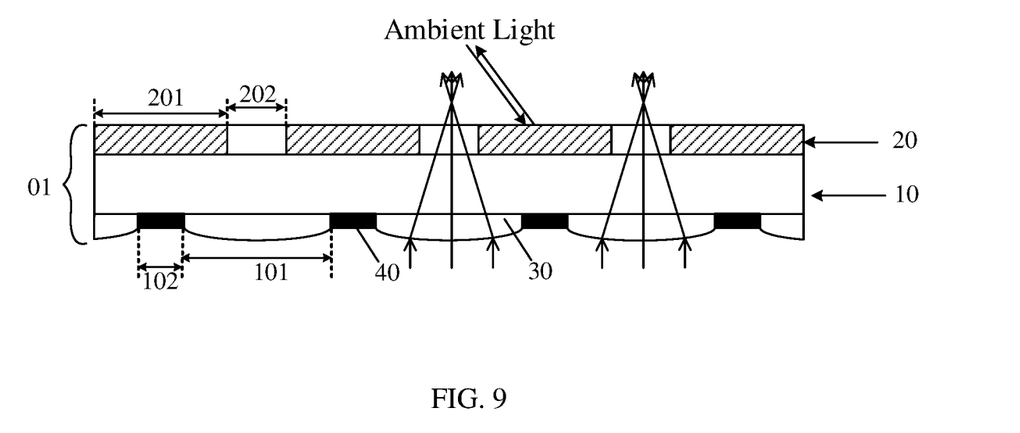
FIG. 9 is a schematic structural view 10 of a display panel provided by an embodiment of the present disclosure.

Moreover, as shown in FIG. 9, the display panel 01 comprises color filter patterns, and a surface of an incident side of the color filter pattern is protruded towards a direction away from the retroreflective layer 20, so as to form the convergent lens 30.

Wherein, the color filter patterns may include red filter patterns, green filter patterns and blue filter patterns. As shown in FIG. 9, the color filter patterns may be spaced from each other through a black matrix pattern 40.

Herein, as the color filter pattern is the convergent lens 30, the color filter pattern not only can have the function of light filtering but also can act as the convergent lens 30.

In the embodiment of the present disclosure, as the color filter pattern is the convergent lens 30, light will be converged after running through the color filter pattern, so more light can be emitted from the transmissive region 202. Moreover, as the color filter patterns not only can filter light but also can converge light, the convergent lenses are not required to be additionally arranged, so the thickness of the display panel 01 can be reduced.

Figure 10:
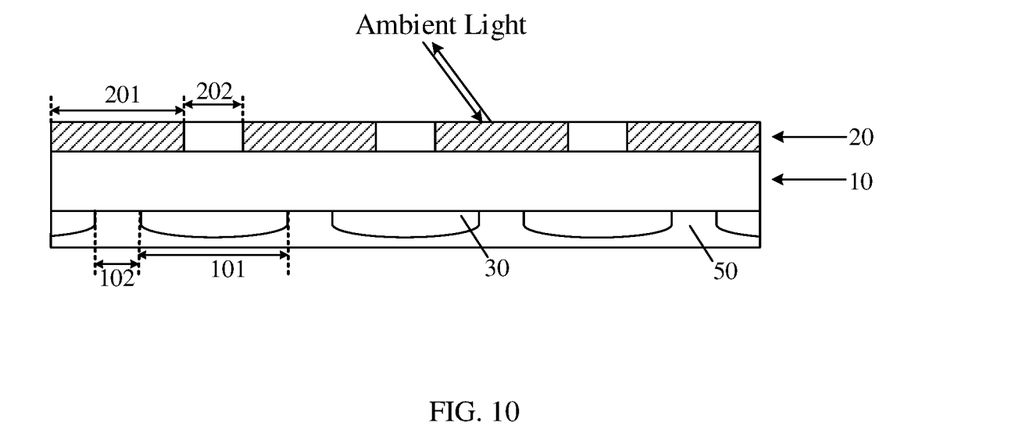
FIG. 10 is a schematic structural view 11 of a display panel provided by an embodiment of the present disclosure.

The convergent lens 30 has a convex surface, thereby being not good for arranging other layers. Therefore, in the embodiment of the present disclosure, moreover, as shown in FIG. 10, the display panel 01 further comprises an overcoat (OC) 50; the OC 50 covers the convex surface of the convergent lens 30; and the refractive index of the OC 50 is less than the refractive index of the convergent lens 30.

Wherein, a material of the OC 50 is not limited, as long as the material is transparent material.

It should be noted that as the convergent lens 30 has a convex surface, when the OC 50 is formed on the convex surface, the OC 50 has a concave surface, and at this point, the convergent lens 30 and the OC 50 arranged directly opposite to the convergent lens form a lens group. For the convenience of arranging the convergent lens 30, the convergent lens 30 may be a plane convex lens, and at this point, the convergent lens 30 has a convex surface. Description is given in the embodiment of the present disclosure by taking the case that the convergent lens 30 has a convex surface as an example.

The focal length f of the lens group is:

$$\frac{1}{f} = \frac{N_1}{f_1} + \frac{N_2}{f_2} \tag{1}$$

Wherein, $N_1$ refers to the refractive index of the convergent lens 30; $f_1$ refers to the focal length of the convergent lens 30; $N_2$ refers to the refractive index of the OC 50; and $f_2$ refers to the focal length of the OC 50. When the focus of the lens group is disposed on the surface of the light-emitting side of the display panel 01, the focal length f of the lens group is equal to the distance t from the lens group to the surface of the light-emitting side of the display panel 01 (herein, the thickness of the convergent lens 30 and the OC 50 is omitted), so $$\frac{1}{f} = \frac{N_1}{f_1} + \frac{N_2}{f_2}. \qquad (1)$$

On this basis, as the focal length of the convergent lens 30 is relevant to the curvature of the convergent lens 30 and the focal length of the OC 50 is relevant to the curvature of the OC 50, the curvature of the convergent lens 30 an the curvature of the OC 50 may be reasonably set according to the distance t from the lens group to the surface of the light-emitting side of the display panel 01, the refractive index of the OC 50, and the refractive index of the convergent lens 30. In general, the refractive index of the OC 50 is 1.5-1.6, and the refractive index of the convergent lens 30 is 1.5-1.7.

Herein, when both the convergent lens 30 and the OC 50 directly opposite to the convergent lens 30 have an arc surface, the curvatures on the arc surface are equal at any position; the focal length of the convergent lens 30 is equal to R/2; the focal length of the OC 50 is equal to –R/2; and R refers to a radius of the convergent lens 30 and the OC 50 directly opposite to the convergent lens 30. When the focus of the lens group is disposed on the surface of the light-emitting side of the display panel 01, the following formula may be obtained according to the formula (1) and the formula (2)

$$\frac{1}{t} = \frac{2(N_1 - N_2)}{R} \qquad (3)$$

Illustratively, if the refractive index of the OC 50 is 1.53, the refractive index of the convergent lens 30 is 1.56, the distance t from the lens group to the surface of the light-emitting side of the display panel 01 is 0.4 mm, the curvature of the convergent lens is 41.667 (1/mm).

An embodiment of the present disclosure provides a display device, which comprises a display panel 01 and a backlight unit. The backlight unit is configured to emit collimated light or approximately collimated light.

Herein, the light emitted from the backlight unit can be formed as being collimated light or approximately collimated light by implementing a directional backlight unit by adoption of backlight of a reverse prism or by bonding a 3M louvered peep-proof film.

In the embodiment of the present disclosure, when the display device is an LCD device and the light emitted from the backlight unit is collimated light or approximately collimated light, the collimated light or the approximately collimated light can be more easily emitted from the transmissive region 202 of the retroreflective layer 20 after converged by the convergent lens 30, so the utilization rate of the light emitted from the backlight unit can be improved.

The embodiments of the present disclosure provide the display panel and the display device. The display panel comprises the retroreflective layer disposed on the light-emitting side; the retroreflective layer includes the retroreflective region; and the retroreflective region can reflect light irradiated thereon along the opposite direction of the incident direction or close to the opposite direction of the incident direction. Thus, the ambient light will be reflected along the opposite direction of the incident direction or close to the opposite direction of the incident direction after incident to the retroreflective region, so the ambient light incident to the retroreflective region of the display panel will not be reflected to enter the human eyes. Therefore, no matter the ambient light is subjected to which kind of reflection (specular reflection, diffuse reflection, Fresnal reflection, etc.) on the surface of the display panel, the ambient light will be subjected to retroreflection as long as the ambient light is incident to the retroreflective regions of the display panel, so the ambient light entering the human eyes after reflected on the surface of the display panel can be reduced, and hence the visual effect of the display panel in the viewing process can be improved.

What are described above is related to the specific embodiments of the disclosure only and not limitative to the scope of the disclosure. The protection scope of the disclosure shall be based on the protection scope of the claims.

The application claims priority to the Chinese patent application No. 201710428613.9, filed Jun. 8, 2017, the disclosure of which is incorporated herein by reference as part of the application.

The invention claimed is:

1. A display panel, comprising a retroreflective layer disposed on a light-emitting side, wherein
the retroreflective layer includes a retroreflective region and a transmissive region, the retroreflective region is configured to reflect light irradiated on the retroreflective region along an opposite direction of an incident direction or close to the opposite direction of the incident direction;
the display panel comprises a pixel region and a pixel define region for defining the pixel region, and the pixel region is at least partially overlapped with the transmissive region along a thickness direction of the display panel,
wherein the retroreflective layer is directly located on an outermost surface of the display panel on the light-emitting side, wherein the outermost surface of the display panel is configured to directly face a viewer,
wherein the display panel comprises a base substrate, the retroreflective layer is disposed on the base substrate, the display panel further comprises a plurality of pixel regions; and convergent lenses disposed on a side of the base substrate opposite to the retroreflective layer and in one-to-one correspondence with the pixel regions,
wherein a primary optical axis of each convergent lens is parallel to the thickness direction of the display panel and runs through a center of the transmissive region of the retroreflective layer,
wherein the transmissive region covers a light spot formed at the retroreflective layer by light converged by the convergent lens.

2. The display panel according to claim 1, wherein the retroreflective region is at least partially overlapped with the pixel define region along the thickness direction of the display panel.

3. The display panel according to claim 1, wherein the retroreflective region is overlapped with the pixel define region and a portion of the pixel region along the thickness direction of the display panel.

4. The display panel according to claim 1, wherein the pixel region is completely overlapped with the transmissive region along the thickness direction of the display panel.

5. The display panel according to claim 1, wherein the transmissive region is a hollowed-out structure.

6. The display panel according to claim 1, wherein the retroreflective region includes a material layer and a plurality of transparent spherical particles; each of the plurality of transparent spherical particles is partially embedded into the material layer; a portion of each of the plurality of transparent spherical particles not embedded into the material layer is close to an outside of the display panel; and
 a refractive index of each of the plurality of transparent spherical particles is different from a refractive index of the material layer.

7. The display panel according to claim 6, wherein a diameter of each of the plurality of transparent spherical particles is 1 μm-10 μm.

8. The display panel according to claim 6, wherein a material of the material layer is niobium pentaoxide; and a material of each of the plurality of transparent spherical particles is polymethyl methacrylate or polycarbonate.

9. The display panel according to claim 6, wherein a height of the portion of each of the plurality of transparent spherical particles not embedded into the material layer is equal to one-half of a diameter of the transparent spherical particles.

10. A display device, comprising the display panel according to claim 1.

11. A display panel, comprising a retroreflective layer disposed on a light-emitting side, wherein
 the retroreflective layer includes a retroreflective region and a transmissive region, the retroreflective region is configured to reflect light irradiated on the retroreflective region along an opposite direction of an incident direction or close to the opposite direction of the incident direction;
 the display panel comprises a pixel region and a pixel define region for defining the pixel region, and the pixel region is at least partially overlapped with the transmissive region along a thickness direction of the display panel,
 wherein the retroreflective layer is directly located on an outermost surface of the display panel on the light-emitting side, wherein the outermost surface of the display panel is configured to directly face a viewer,
 wherein the retroreflective region includes a material layer and a plurality of transparent spherical particles; each of the plurality of transparent spherical particles is partially embedded into the material layer; a portion of each of the plurality of transparent spherical particles not embedded into the material layer is close to an outside of the display panel; and
 a refractive index of each of the plurality of transparent spherical particles is different from a refractive index of the material layer,
 wherein a diameter of each of the plurality of transparent spherical particles is 1 μm-10 μm,
 a material of the material layer is niobium pentaoxide; and a material of each of the plurality of transparent spherical particles is polymethyl methacrylate or polycarbonate.

12. The display panel according to claim 11, wherein the retroreflective region is at least partially overlapped with the pixel define region along the thickness direction of the display panel.

13. The display panel according to claim 11, wherein the retroreflective region is overlapped with the pixel define region and a portion of the pixel region along the thickness direction of the display panel.

14. The display panel according to claim 11, wherein the pixel region is completely overlapped with the transmissive region along the thickness direction of the display panel.

15. The display panel according to claim 11, wherein the transmissive region is a hollowed-out structure.

16. The display panel according to claim 11, wherein a height of the portion of each of the plurality of transparent spherical particles not embedded into the material layer is equal to one-half of a diameter of the transparent spherical particles.

17. The display panel according to claim 11, wherein the display panel comprises a base substrate, the retroreflective layer is disposed on the base substrate, the display panel further comprises a plurality of pixel regions; and convergent lenses disposed on a side of the base substrate opposite to the retroreflective layer and in one-to-one correspondence with the pixel regions,
 wherein a primary optical axis of each convergent lens is parallel to the thickness direction of the display panel and runs through a center of the transmissive region of the retroreflective layer.

18. The display panel according to claim 17, wherein the transmissive region covers a light spot formed at the retroreflective layer by light converged by the convergent lens.

19. The display panel according to claim 18, wherein a focal length of the convergent lens is equal to a distance from a center of the convergent lens to a surface of the light-emitting side of the display panel.

20. A display panel, comprising a retroreflective layer disposed on a light-emitting side, wherein
 the retroreflective layer includes a retroreflective region and a transmissive region, the retroreflective region is configured to reflect light irradiated on the retroreflective region along an opposite direction of an incident direction or close to the opposite direction of the incident direction;
 the display panel comprises a pixel region and a pixel define region for defining the pixel region, and the pixel region is at least partially overlapped with the transmissive region along a thickness direction of the display panel,
 wherein the retroreflective layer is directly located on an outermost surface of the display panel on the light-emitting side, wherein the outermost surface of the display panel is configured to directly face a viewer,
 wherein the display panel comprises a base substrate, the retroreflective layer is disposed on the base substrate, the display panel further comprises a plurality of pixel regions; and convergent lenses disposed on a side of the base substrate opposite to the retroreflective layer and in one-to-one correspondence with the pixel regions,
 wherein a primary optical axis of each convergent lens is parallel to the thickness direction of the display panel and runs through a center of the transmissive region of the retroreflective layer,
 wherein the transmissive region covers a light spot formed at the retroreflective layer by light converged by the convergent lens,
 wherein a focal length of the convergent lens is equal to a distance from a center of the convergent lens to the surface of the light-emitting side of the display panel.

* * * * *